(12) United States Patent
Sorenson, Jr.

(10) Patent No.: US 6,717,397 B2
(45) Date of Patent: Apr. 6, 2004

(54) CURRENT MEASUREMENT DEVICE

(75) Inventor: Thomas Sorenson, Jr., Annacotty (IE)

(73) Assignee: Suparules Limited, Castleroy (IE)

( * ) Notice: Subject to any disclaimer, the term of this patent is extended or adjusted under 35 U.S.C. 154(b) by 0 days.

(21) Appl. No.: 10/257,779

(22) PCT Filed: Apr. 12, 2001

(86) PCT No.: PCT/IE01/00049

§ 371 (c)(1),
(2), (4) Date: Dec. 23, 2002

(87) PCT Pub. No.: WO01/79869

PCT Pub. Date: Oct. 25, 2001

(65) Prior Publication Data

US 2003/0112000 A1 Jun. 19, 2003

(30) Foreign Application Priority Data

Apr. 17, 2000 (IE) .......................................... S20000276

(51) Int. Cl.$^7$ ................................................. G01R 19/00
(52) U.S. Cl. ..................... 324/126; 324/127; 324/117 R
(58) Field of Search ................................ 324/126, 127, 324/117 R, 117, 500, 142, 141; 327/172, 559; 323/48, 60, 112

(56) References Cited

U.S. PATENT DOCUMENTS 5,793,196 A * 8/1998 White .......................... 324/127
5,949,231 A * 9/1999 Lau .............................. 324/127
5,953,121 A * 9/1999 Bohnert et al. ............. 356/481
6,614,218 B1 * 9/2003 Ray ........................ 324/117 R

FOREIGN PATENT DOCUMENTS

| JP | 01047959 A | 2/1989 |
| JP | 06043189 A | 2/1994 |
| SU | 1800374 A1 | 3/1993 |

* cited by examiner

*Primary Examiner*—Kamand Cuneo
*Assistant Examiner*—Jimmy Nguyen
(74) *Attorney, Agent, or Firm*—Whiteford, Taylor & Preston LLP; Gregory M. Stone; Jeffrey C. Maynard (57) ABSTRACT

A device for measuring alternating current in a conductor comprising an even number of identical coils (C1) to (C14) mounted on an electrically insulating coil support member (10). Half the coils (C1) to (C7) are equally spaced around a first notional circle and are connected in series by a first conductive track (12) and the other half of the coils (C) to (C14) are equally spaced around a second notional circle, concentric with the first, and are connected in series by a second conductive track (14). The support member (10) has a recess (16) to allow a conductor under test to be introduced into the centre of the concentric circles. The device further includes means (R1, R2, 20) for deriving the alternating current in the conductor as a function of the voltages induced in the first and second sets of series-connected coils. The coils (C1) to (C14) and the support member are manufactured by printed circuit or thick film technology.

18 Claims, 7 Drawing Sheets

CURRENT MEASUREMENT DEVICE

This invention relates to a device for measuring alternating current flowing in an electric conductor such as, for example, an insulated a.c. mains wire.

It is an object of the invention to provide such a device which may be constructed at low cost, which has no moving parts, and which may be made with high precision.

According to the present invention there is provided a device for measuring alternating current in a conductor, the device comprising a first set of coils each comprising at least one conductive track deposited on an electrically insulating body, and an electrically insulating coil support member, wherein said coils are mounted on the support member along a path defining a notional loop and are connected in series by a conductive track deposited on the support member, the support member being configured to allow a conductor to be introduced into the into the interior of the notional loop with the axis of the conductor normal to the plane containing the coils, the device further including means for deriving the alternating current in the conductor as a function of the voltages induced in the series-connected coils.

In a preferred embodiment there are an even number 2N of substantially identical coils, with a first set N of the coils mounted on the support member substantially equally spaced around a first notional circle and connected in series by a first conductive track deposited on the support member, and a second set N of the coils mounted on the support member substantially equally spaced around a second notional circle and connected in series by a second conductive track deposited on the support member, the second circle being substantially concentric with the first circle, the support member being configured to allow a conductor to be introduced into the centre of the concentric circles with the axis of the conductor normal to the plane containing the coils, and the device further including means for deriving the alternating current in the conductor as a function of the voltages induced in the first and second sets of series-connected coils.

An embodiment of the invention will now be described, by way of example, with reference to the accompanying drawings, in which.

Figure 1:
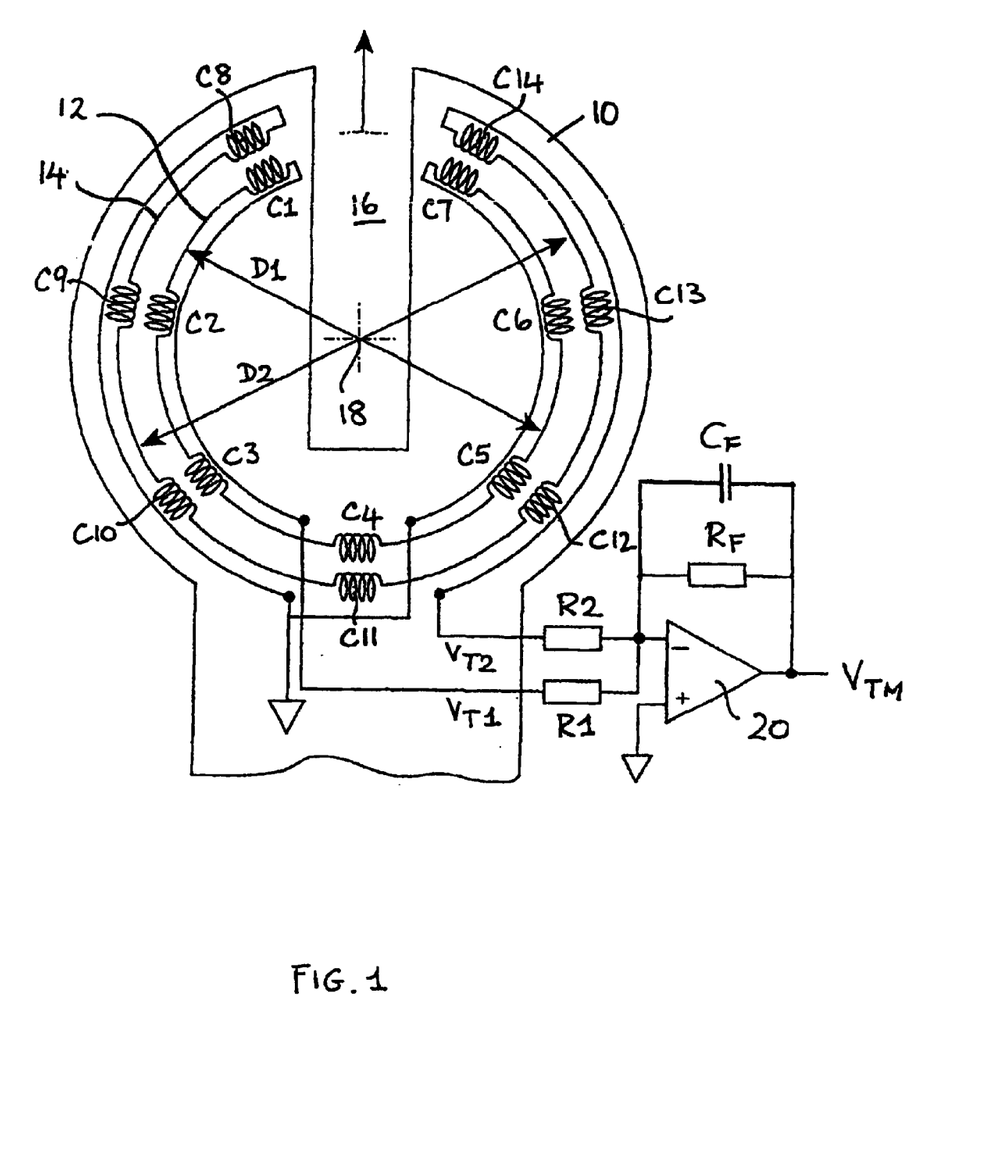
FIG. 1 is a circuit diagram of a device according to the invention, presented to illustrate the principles of operation.

Referring to FIG. 1, fourteen small, substantially identical coils C1 to C14 of non-magnetic material are mounted on a support member 10 of electrically insulating material. The coils C1 to C7 are mounted on the member 10 substantially equally spaced around a first notional circle of diameter D1 and are connected in series by a non-magnetic conductor 12. Similarly, the coils C8 to C14 are mounted on the member 10 substantially equally spaced around a second notional circle of diameter D2 and are connected in series by a second non-magnetic conductor 14. The second circle is substantially concentric with the first circle. The magnetic axis of each coil C1 to C14 is substantially tangential to the respective circle on which it lies, and each coil of the set of coils C1 to C7 is substantially radially aligned with a respective coil of the set of coils C8 to C14, i.e. the coils are radially aligned in pairs C1/C8, C2/C9, etc. In the embodiment to be described with reference to FIGS. 4 to 7, which implements the above circuit, the diameter D1 is 0.044 meters and the diameter D2 is 0.048 meters.

The support member 10 has a slot 16 extending from its periphery to a point beyond the centre 18 of the concentric circles of diameter D1 and D2. This allows a conductor under test (not shown) to be introduced into the centre of the coils C1 to C14 with the axis of the conductor normal to the plane containing the coils (i.e. normal to the plane of FIG. 1). Provided the axis of the conductor under test is close to the point 18, say within about 1 cm with D1 and D2 having the dimensions given above, an accurate measurement of the alternating current in the conductor can be measured. This is demonstrated as follows.

Assume that the conductor under test, whose current I is to be measured, is placed in the centre 18 of the concentric circles of FIG. 1 with its longitudinal axis perpendicular to the plane of the page. The magnetic field $H_C$ created by this, current at the circumference of the circle of diameter D1 is directed along the circumference and its magnitude is the same at each of the seven inner coils C1 to C8 located around the circumference. This magnitude $H_{C1}$ is given by:

$$H_{C1} = \frac{I}{\pi D1}$$

The total magnetic flux linking each of the seven inner coils is given by:

$$\phi = \mu N A H_{C1}$$

where N is the number of turns in an individual coil, $\mu$ is the magnetic permeability of free space and A is the average area enclosed by a single turn of the coils. The voltage V induced in each individual coil is the time differential of this magnetic flux:

$$v = \frac{d\phi}{dt}$$

or, for a current of frequency f:

$$V = j2\pi f \phi$$

Since all the seven inner coils shown in FIG. 1 are connected in series and their individual voltages V are all in phase, for a current source at the centre, the total output voltage $V_{T1}$ from the inner set of coils is:

$$V_{T1} = 7V = j14\pi f \mu N A H_{C1} = \frac{14\pi f \mu N A I}{\pi D1} = \frac{14 f \mu N A I}{D1} \quad (1)$$

Similarly the voltage $V_{T2}$ picked up by the outer set of seven coils C8 to C14 on the circle of diameter D2 is:

$$V_{T2} = \frac{14 f \mu NAI}{D2} \quad (2)$$

If the current source is now moved outside the outer set of coils C8 to C14, i.e. outside the slot 16, the magnitude of the magnetic field is no longer the same around the circumference of the inner circle and the circumferential component of the magnetic field cutting the individual coils is no longer in the same direction for each of the coils in the set. As a result the voltage induced in each of the coils of a set varies in magnitude and a phase inversion of the voltage occurs when the circumferential component of the magnetic field changes direction from clockwise in one coil to anticlockwise in another coil of the set.

These voltages are summed over the seven inner coils C1 to C7 resulting in a much lower level pickup voltage $V_{T1}$ from an outside source as the phase inverted voltages from some coils subtract from the in phase voltages of others.

It can be shown for the system presented in FIG. 1 that the total pickup voltage from an outside source is larger for the outer set of seven coils C8 to C14 than for the inner set C1 to C7 by a proportion which is almost independent of the distance of the outside source from the outer set of coils. Thus interference from outside sources can be substantially reduced further by subtracting a fixed portion of the voltage induced in the outer set from the voltage induced in the inner set.

For example if the diameter of the inner set of coils is 0.044 meters and the diameter of the outer set of coils is 0.048 meters, with seven coils in each set, optimum reduction of outside interference is obtained by taking as the output voltage of the device the value $V_T$ where:

$$V_T = V_{T1} - 0.59 V_{T2} \quad (3)$$

In FIG. 1, this value $V_T$ is derived by applying the voltages $V_{T1}$ and $V_{T2}$ across resistors R1 and R2 respectively in common to the negative input of an amplifier 20 having a feedback resistor $R_F$. A Capacitor $C_F$ may also be placed in parallel with $R_F$ to remove the frequency dependence of the input voltage $V_T$. The proportion of $V_{T2}$ that is subtracted from $V_{T1}$ in the output of the comparator is directly proportional to the ratio of the resistor values R1/R2, so that by appropriate choice of R1 and R2 the desired value $V_T$ can be obtained.

For a current source $I_M$ placed at the centre of the two coil sets the pickup voltage $V_{TM}$ is obtained from equation (3) for the device using the values of $V_{T1}$ and $V_{T2}$ calculated from equations (1) and (2) respectively using D1=0.044 meters and D2=0.048 meters to give:

$$V_{TM} = 146 \mu NAf I_M \quad (4)$$

Returning again to the rejection of interfering sources outside both coil sets, as the interfering current source moves further and further away from the device, the magnetic field it creates in the vicinity of the coils becomes more and more uniform in magnitude and direction over the area of the probe. As a consequence the voltages $V_{T1}$ created across the inner set of coils and $V_{T2}$ created across the outer set get smaller and smaller and further reduction in pickup voltage from interfering sources takes place when $V_T$ is calculated from equation (3).

The reduction in $V_{T1}$ and $V_{T2}$ that should occur, as the field becomes more uniform for far away sources, only takes place if all seven coils in the inner and outer sets are identical and pick up the circumferential component of magnetic field only. The effect of non-uniform construction of coils on the rejection of magnetic field pickup from far away sources is now examined.

Figure 2:
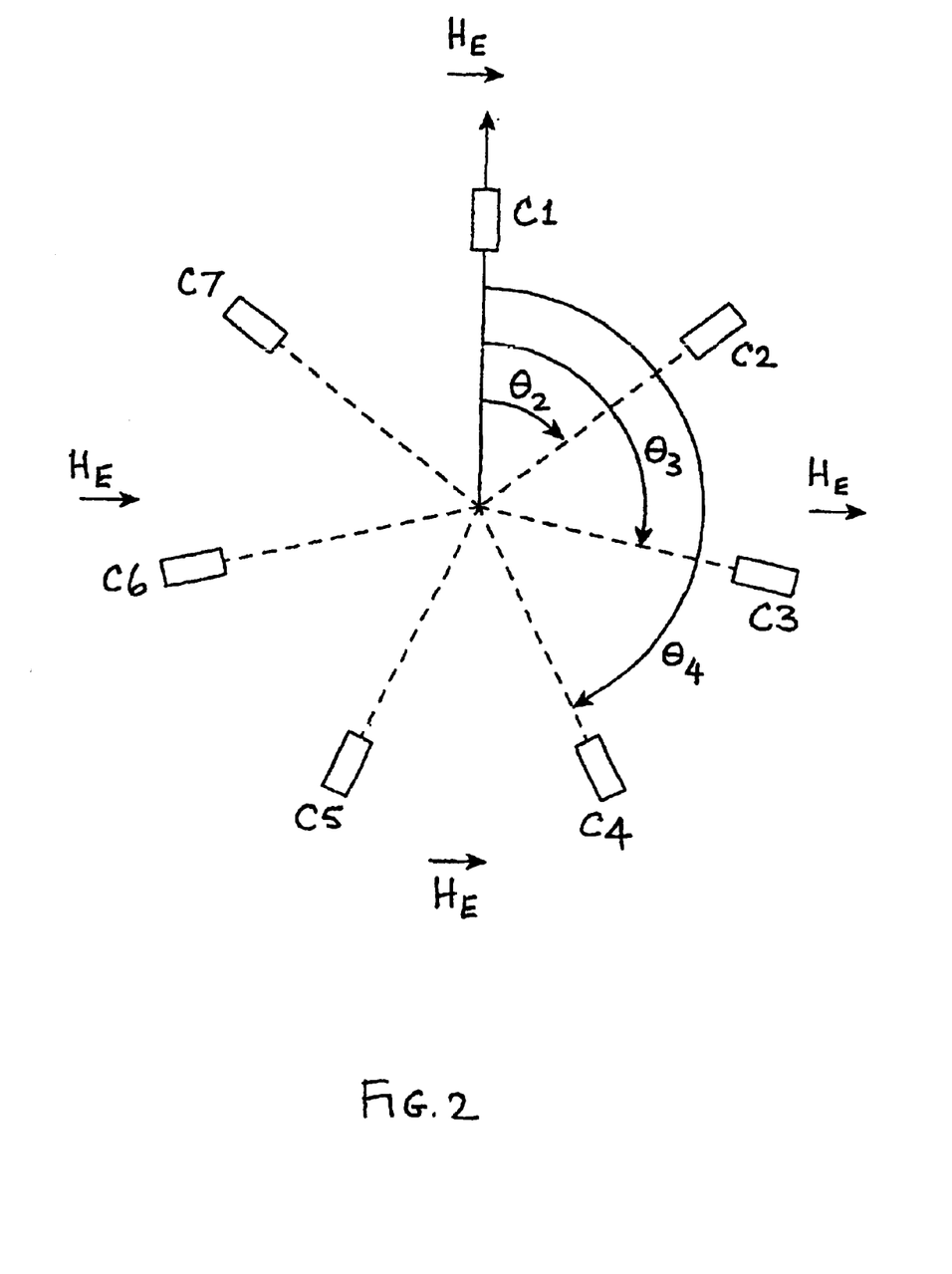
FIG. 2 is a diagram to illustrate the effect of non-uniform construction of the coils.

FIG. 2 shows a set of seven coils C1 to C7 equiangularly placed around a circle and subjected to an externally created magnetic field $H_E$ which is the same at all the coils and which only has a horizontal component of magnetic field as shown. This is the type of magnetic field created by a faraway interfering source. If each coils picks up only the circumferential component of magnetic field then a clockwise magnetic field component at a coil induces an in phase voltage whilst an anticlockwise component induces an out of phase voltage.

Let $\theta_n$ be the angle that the radius from the centre of the circle to coil n makes with the vertical axis as shown. The clockwise component of magnetic field $H_{cn}$ linking coil n is given by $H_{cn} = H_E \cos \theta_n$ and the voltage $V_{cn}$ induced in this coil is given by:

$$V_{CN} = j2\pi f \mu N_n A_n H_{cn} = j2\pi f \mu N_n A_n H_E \cos \phi_n$$

where $N_n$ is the number of turns in coil n and $A_n$ is the average cross sectional area of the turns of coil n.

The total voltage $V_{T1}$ obtained when all seven outputs are connected in series gives:

$$V_{T1} = \sum_{n=1}^{7} V_{cn} = j 2\pi f \mu H_E \sum_{n=1}^{7} N_n A_n \cos \phi_n \quad (5)$$

and for uniformly spaced coils $\theta_n$ in degrees=360(n-1)/7 where n is the coil number.

If the number of turns in each coil $N_n$ and the average area $A_n$ of each coil turn are identical with values N and A respectively then:

$$V_{T1} = j 2\pi f \mu NAH_E \sum_{n=1}^{7} \cos \phi_n$$

For the coils uniformly spaced:

$$\sum_{n=1}^{7} \cos \phi_n = 0$$

and so $V_{T1} = 0$ resulting in no interference voltage pickup from a uniform magnetic field.

If the coils are not all identical or are not uniformly spaced a voltage pickup from the uniform field will take place.

For example in a situation where coils C2 to C7 are identical but coil C1 has an average turn area larger or smaller than the others by 1% so that A1=1.01A or 0.99A then the magnitude of the voltage pickup $V_{T1}$ from equation (5) is:

$$V_{T1} = (0.01) 2\pi NAH_E$$

If the outer set of coils shown in FIG. 1 are all identical then $VT_2=0$ and the total output voltage from the device, $V_T$, as given by equation (3), yields:

$$V_T = (0.01) 2\pi f \mu NAH_E \quad (6)$$

European specifications for a Class 1, 20 amp mains supply power meter requires that a uniform external magnetic filed $H_E$ of 400A/m at the mains frequency should cause a maximum error of less than 2% when the current estimating device is measuring a test current of 2 amps in a conductor placed at the centre of the coil sets.

The interference voltage $V_T$ obtained if all the coils are identical except for one coil which varies by 1% from the others due to an external magnetic field $H_E$ of 400A/m is given by equation (6) as:

$$V_{TM}=25\mu NAf \qquad (7)$$

The measured output voltage of the probe $V_{TM}$ with a current of 2 Amps flowing in a test conductor placed in the measurement area inside the probe is given by equation (4):

$$V_{TM}=292\mu NAf \qquad (8)$$

In order to meet the European specifications for Class 1 meters the interference pickup voltage $V_T$ given by equation (7) should be less than 2% of the measured voltage $V_{TM}$ given by equation (8).

$V_T$ given by equation (7) is in fact 8.6% of $V_{TM}$. Therefore a device of the form outlined in FIG. 1 but having one of coils differing by only 1% from all the others would fail to meet the specifications of Class 1 meters.

In fact a variation in dimensions of less than ±0.2% in individual coils is required to come within the specifications.

Through the use of small, identical, non-magnetic material coils C1 to C14 and connecting conductors 12 and 14, and the absence of moving parts, a device constructed according to the above principles has the potential to be a very low cost product to manufacture in large quantities. However, it would be very difficult with conventional wire wound coils to achieve the required precision and even if one could the resultant cost would be high.

However, printed circuit board or thick film technology, wherein conductive tracks are deposited on sheets or layers of insulating material, offers a lower cost, more consistent manufacturing technology for the device, and is used in the embodiment now to be described with reference to FIGS. 4 to 6.

Figure 3:
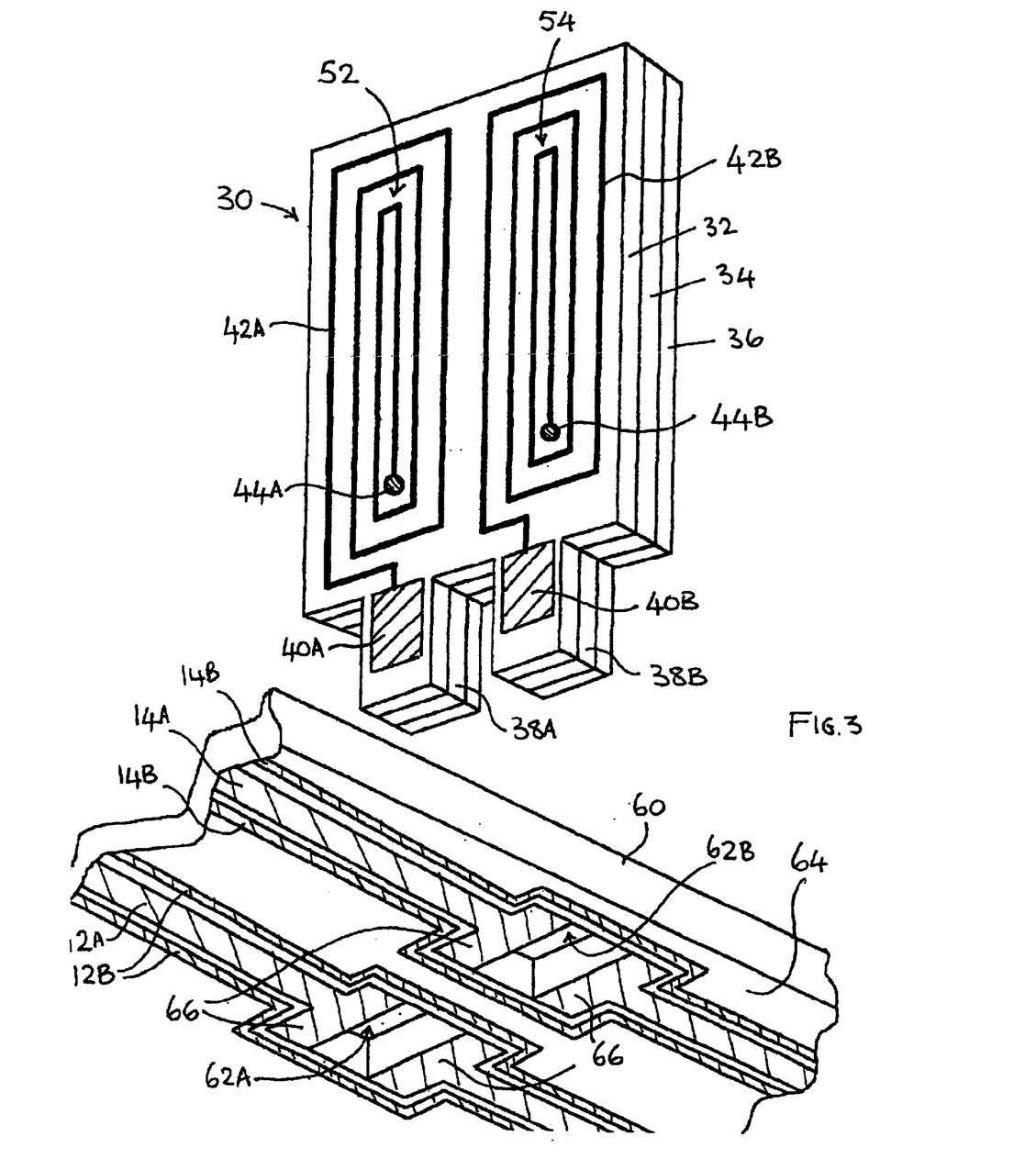
FIG. 3 is an enlarged perspective view of part of an embodiment of the invention.

FIG. 3 shows, to a greatly enlarged scale, a coil unit 30 made by, for example, multilayer thick film or PCB (printed circuit board) technology. The unit is a laminate of three substantially parallel layers 32, 34, 36 of insulating material, which may be ceramic, printed circuit board material or the like bonded together using conventional techniques. The geometrical shape of the laminate is symmetrical about a centre plane normal to the layers 32 to 36 and has two dependant feet 38A, 38B.

Figure 5:
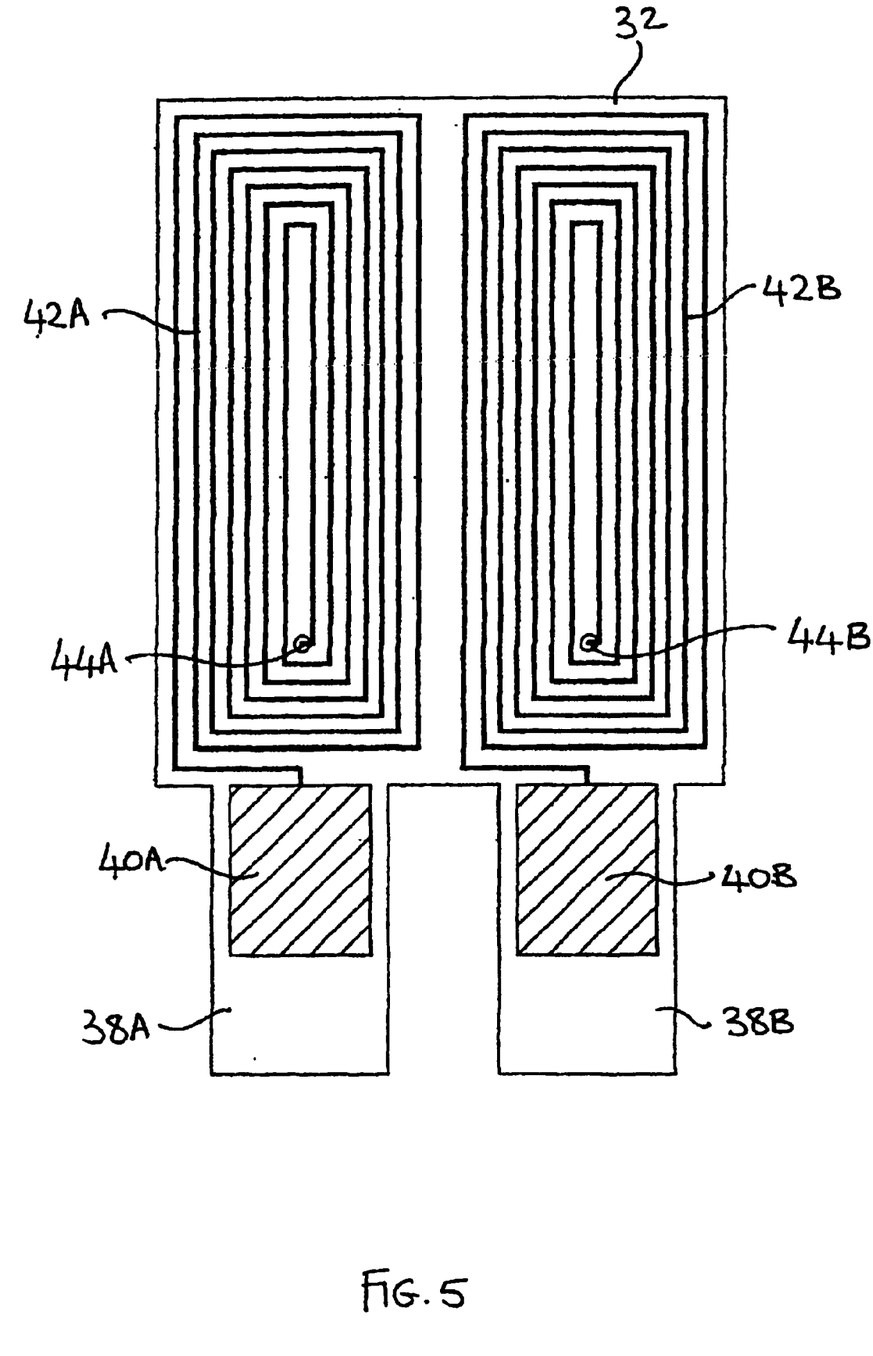
FIG. 5 is a front (or rear) view of one of seven substantially identical coil units used in the embodiment and showing the printed conductive tracks on the outer major surfaces of each of the two outer ones of the three insulating layers making up the coil unit.

The exposed major surface of the outer layer 32 (i.e. the surface seen in FIG. 3) has deposited thereon two conductive pads 40A, 40B each on a respective foot 38A, 38B and two substantially identical generally helical conductive tracks 42A and 42B (see also FIG. 5, where the helical tracks 42A, 42B are seen in greater detail). Each track 42A, 42B terminates at its outer end at a respective solder pad 40A, 40B and at its inner end at a respective conductively plated via hole 44A, 44B extending through the thickness of the layer 32. The exposed major surface of the other outer layer 36, not visible in FIG. 3, has solder pads 40A, 40B, tracks 42A, 42B and via holes 44A, 44B which are substantially identical to those on the layer 32. In other words, when the coil unit 30 is viewed from the other side, the exposed major surface of the layer 36 looks just like the major surface of the layer 32 seen in FIGS. 3 and 5.

Figure 6:
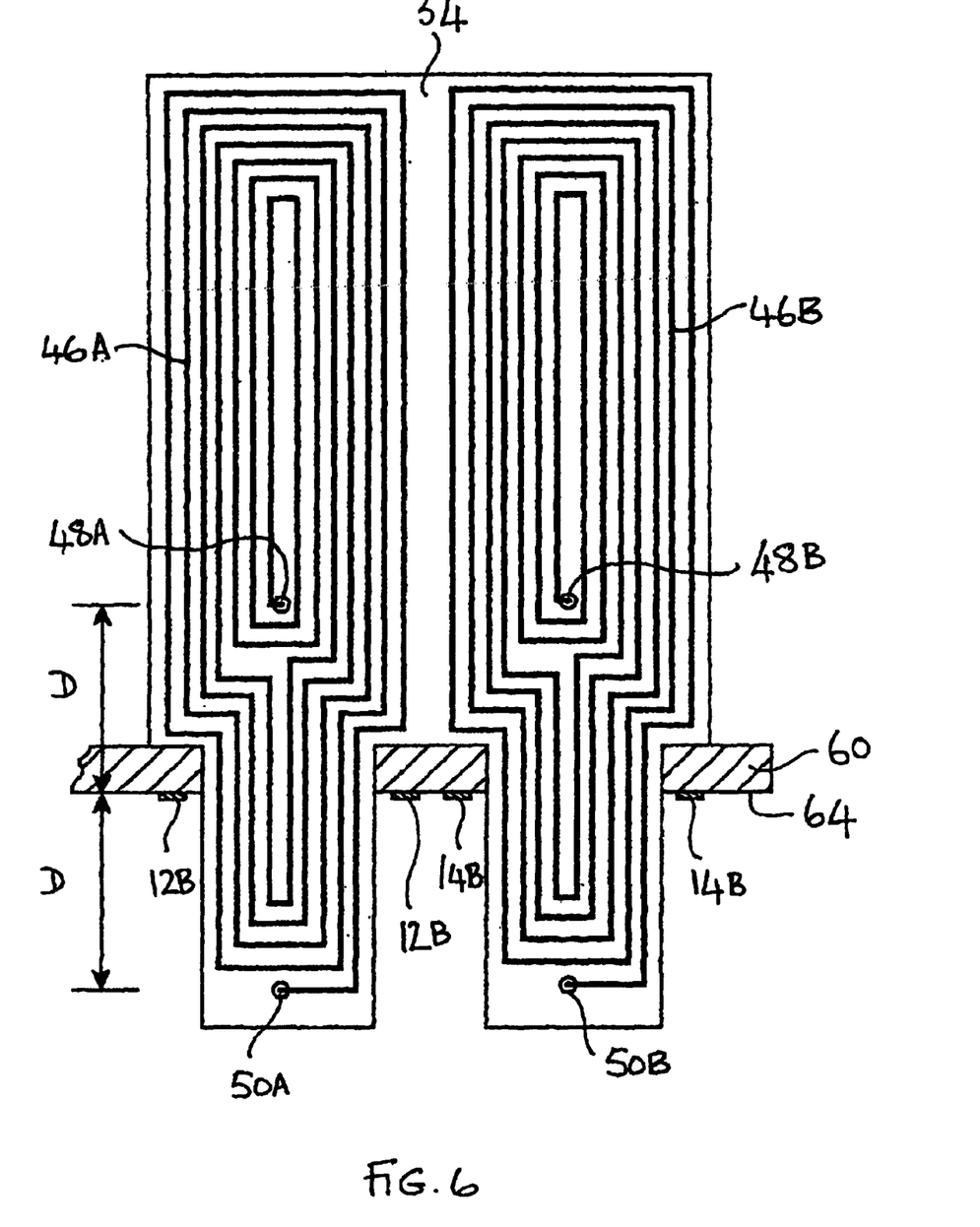
FIG. 6 shows the printed conductive tracks on each of the two opposite major surfaces of the central one of the three insulating layers making up each coil unit.

The inner layer 34 of the laminate, i.e. the layer sandwiched between the outer layers 32 and 36, has two substantially identical generally helical conductive tracks 46A and 46B, FIG. 6, deposited on each of its opposite major surfaces (only one such surface is seen in FIG. 6, but the opposite major surface looks just the same). Each track 46A, 46B terminates at its inner end at a respective conductive pad 48A, 48B and at its outer end at a respective conductively plated via hole 50A, 50B. The via holes 50A, 50B pass through the thickness of the layer 34 and connect the outer ends of the tracks 46A, 46b to the outer ends of the like tracks on the opposite major surface of the layer 34. The conductive pads 48A, 48B connect the inner ends of the tracks 46A, 46B to the inner ends of the tracks 42A, 42B through the via holes 44A, 44B.

Thus, to the left hand side (as seen in FIG. 3) of the centre plane of symmetry of the coil unit 30 there are four helical tracks 42A/46A/46A/42A, in that order through the unit, connected together in series to form a multilayer coil generally indicated 52. Likewise, to the right hand side of the centre plane of symmetry of the coil unit 30 there are four helical tracks 42B/46B/46B/42B, in that order through the unit, connected together in series to form a second multilayer coil generally indicated 54 and identical to the coil 52. All the helical tracks 42A, 42B, 46A and 46B may be formed by conventional PCB or thick film deposition techniques on the various layers of the coil unit 30, and are made of a non-magnetic electrically conductive material.

In the present embodiment there are seven identical coil units 30 and, as will be described, in the finished device the left hand coil 52 of each unit constitutes a respective one of the inner set of coils C1 to C7 and the right hand coil 54 constitutes a respective one of the outer set of coils C8 to C14. Having two coils on one multilayer unit reduces cost and improves mechanical stability and alignment of inner and outer sets of coils.

Figure 4:
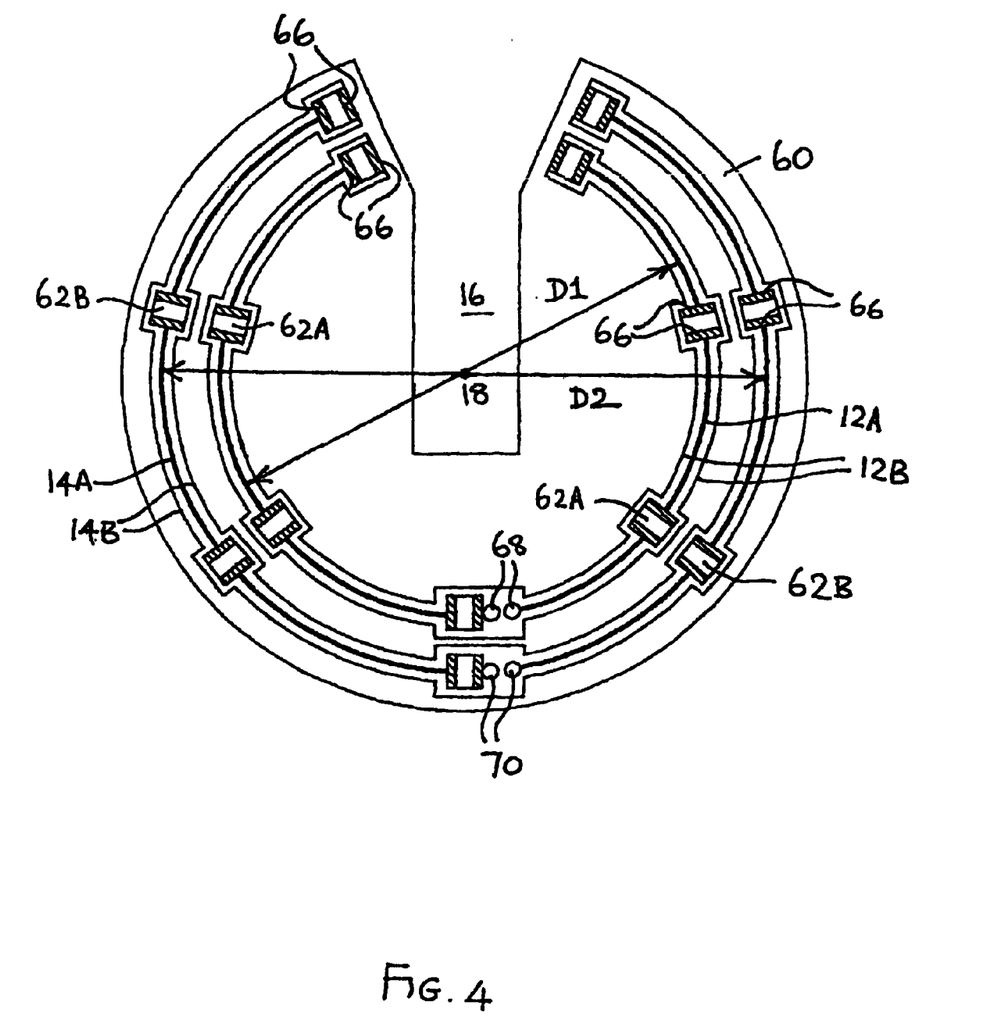
FIG. 4 is a plan view of the underside of the coil support plate of the embodiment showing the printed conductive tracks thereon.

The seven identical coil units 30 are mounted on an electrically insulating coil support plate 60, FIGS. 3 and 4, corresponding to the support member 10 of FIG. 1. The support plate 60 may be made of ceramic, printed circuit board material or the like. The plate 60 has seven pairs of rectangular apertures 62A, 62B extending fully through the thickness of the plate. Each pair of apertures 62A, 62B is dimensioned to snugly receive the pair of feet 38A, 38B of a respective coil unit 30, the foot 38A being inserted in the aperture 62A and the foot 38B being inserted in the aperture 62B. The feet 38A, 38B are inserted into the respective apertures 62A, 62B from the top of the plate 60 (as seen in FIG. 3) and have a depth greater than the thickness of the plate 60 so that the solder pads 40A, 40B protrude below the bottom surface 64 of the plate.

On the bottom surface 64 of the plate 60 there is a respective solder pad 66 on each side of each aperture 62A, 62B. When the feet 38A, 38B are pushed fully home in the apertures 62A, 62B the solder pads 40A, 40B on each side of the coil unit 30 are soldered to the adjacent solder pads 66. This holds the units 30 firmly in place in the plate 60. A plastics jig (not shown) may be used to hold the coil units 30 while soldering and until the solder sets to ensure that the insulating layers 32 to 36 of each unit 30 are fixed precisely normal to the plate 60.

The disposition of the pairs of apertures 62A, 62B in the coil support plate 60 is such that when the coil units 30 are soldered in place the multilayer coils 52 are disposed on a circle of diameter D1 (FIG. 1) and the multilayer coils 54 are disposed on a circle of diameter D2 concentric with D1. Further, the magnetic axis of each coil 52, 54 is tangential to the respective circle on which it lies and each coil 52 is precisely radially aligned with its neighbour 54 by virtue of them being formed in the same unit 30.

As seen in FIG. 4, the set of inner coils 52 are connected in series across a pair of output terminals 68 by an inner track portion 12A which runs from one solder pad 66 to the next coincident with the circle of diameter D1 and two outer return track portions 12B substantially parallel to and one on either side of the track portion 12A and substantially equally spaced therefrom. Likewise, the set of outer coils 54 are connected in series across a pair of output terminals 70 by an inner track portion 14A which runs from one solder pad 66 to the next coincident with the circle of diameter D2 and two outer return track portions 14B substantially parallel to and one on either side of the track portion 14A and substantially equally spaced therefrom. The track portions 12A and 12B correspond to the track 12 of FIG. 1 and the track portions 14A and 14B correspond to the track 14 of FIG. 1. All the track portions 12A, 12B, 14A and 14B may be formed by conventional PCB or thick film deposition techniques on the bottom surface 64 of the support plate 60, and like the coils 52 and 54 are made of a non-magnetic electrically conductive material. In the finished device the output terminals 68, 70 are connected to an amplifier 20 in the manner shown in FIG. 1.

The particular arrangement of the conductive tracks 12A, 12B and 14A, 14B joining the coil units 30 in series, as shown in FIG. 4, is used to mitigate the effect of interference voltage pickup by these tracks from externally applied magnetic fields. The method by which reduced interference pickup is achieved with the arrangement is now discussed.

The interconnect arrangement shown in FIG. 1 for the inner set of coils C1 to C7 is first examined (the same principles apply to the outer set of coils). This arrangement is shown again schematically in FIG. 7A with a uniform externally applied interference magnetic filed $H_E$ present whose direction is normal to the page as shown.

Figure 7A:
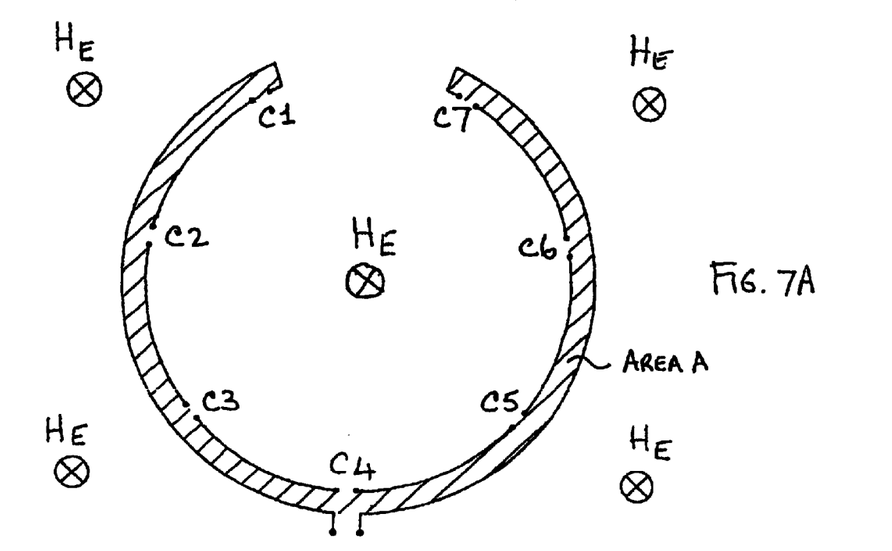
FIGS. 7A and 7B illustrate how the conductors joining the coils in series are constructed for minimum interference with the coil outputs.

The magnetic flux $\phi$ linking the interconnect conductors due to the interfering field is given by $\phi = \mu A H_E$, where A is the area of the shaded region shown between the interconnecting conductors.

As before the magnitude of the interfering voltage generated by this flux linkage is given by:

$$2\pi f \phi = 2\pi f \mu A H_E$$

This interference will add at the output to any voltage generated in the coils themselves. The only way this can be minimised with the arrangement of FIG. 7A is to move the inner and outer conducting tracks as close as possible together to minimise the area A. On a single-sided PCB there is a limit on how close two tracks may be reliably laid without incurring extra cost. This is of the order of 0.3 mm in today's standard technology. It may be shown however that even with this small spacing interference pickup from the interconnect tracks for typical probe dimensions will exceed the class 1 specification limits.

Figure 7B:
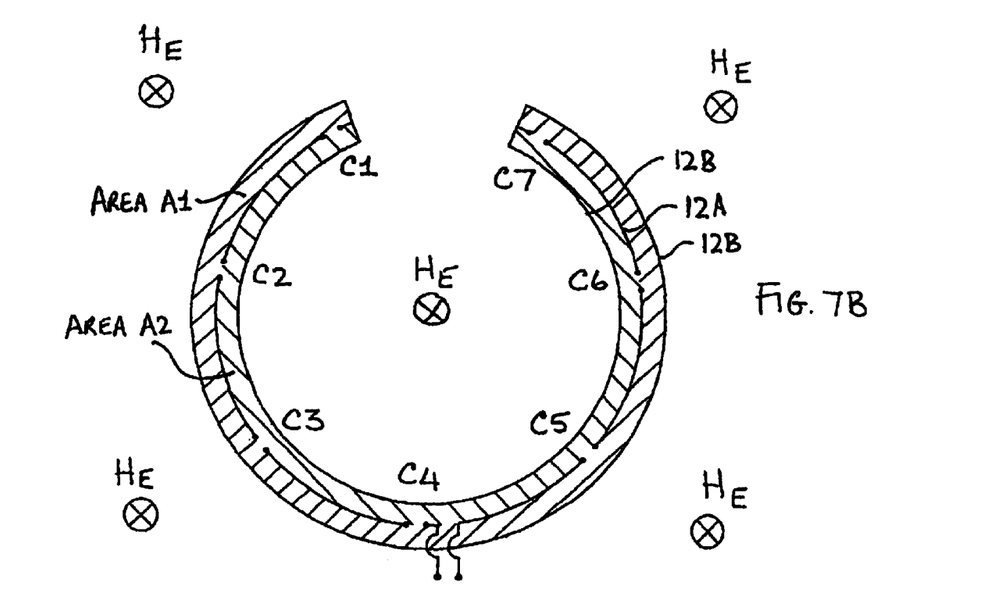

The interference pickup from the interconnect tracks due to a uniform magnetic field may be greatly reduced if the system shown in FIG. 7B is adopted, as is done in the embodiment of FIGS. 3 to 6. In this implementation the output is taken as shown and the interconnect between coils C1 and C7 is achieved using two return tracks as shown. If the cross hatched area A1 is equal to the other cross hatched area A2 then the voltages induced clockwise around the conductors surrounding area A1 due to magnetic flux linkage will be equal to the voltage induced clockwise around the conductors surrounding area A2. These voltages are opposite in direction to one another in the centre conductor inducing no voltage between the output terminals. A voltage is induced around the two outside conductors causing current flow in that loop but this does not affect the output voltage. For the track layout shown in FIG. 4 this system of interference suppression, using equal areas, is implemented separately for the inner and outer set of coils as shown.

Another area where stray coupling from magnetic fields can occur is pickup due to magnetic flux linkage between the via holes 44A/50A and 44B/50B in the multilayer coil units and the pairs of return tracks 12B and 14B respectively from the first to the last coil in each set. The magnetic flux coupling to these via holes is small since the length of the via holes is small. This coupling can be minimised further, however, by ensuring that the distance D of via holes 44A/44B above the return tracks is equal to the distance D of via holes 50A/50B below the return tracks, FIG. 6 (it will be appreciated that although the via holes 44A and 44B are not shown in FIG. 6 they are coincident with the pads 48A/48B). The voltage induced between via holes 44A/44B and the return tracks is then cancelled by an equal but opposite voltage between the via holes 50A/50B and the return tracks.

The invention is not limited to the embodiment described herein which may be modified or varied without departing from the scope of the invention.

What is claimed is:

1. A device for measuring alternating current in a conductor, the device comprising:
    a) a first set of coils each comprising at least one conductive track deposited on an electrically insulating body, and an electrically insulating coil support member,
    b) wherein said coils are mounted on the support member along a path defining a notional loop and are connected in series by a conductive track deposited on the support member,
    c) the support member being configured to allow a conductor to be introduced into the interior of the notional loop with the axis of the conductor normal to the plane containing the coils, and
    d) the device further including means for deriving the alternating current in the conductor as a function of the voltages induced in the series-connected coils.

2. A device as claimed in claim 1, wherein each of said coils is substantially identical to the others.

3. A device as claimed in claim 1, wherein said path defining a notional loop is a circular path.

4. A device as claimed in claim 3, wherein the magnetic axis of each coil is substantially tangential to the respective circle.

5. A device as claimed in claim 3, wherein said coils are substantially equally spaced around said circle.

6. A device as claimed in claim 1, wherein a second set of coils is mounted on the support member along a second path defining a second notional loop and the coils of said second set are connected in series by a conductive track deposited on the support member.

7. A device as claimed in claim 6, wherein each of said first and second sets comprises a number N of coils, providing a total number 2N of said coils mounted on said support member.

8. A device as claimed in claim 7, wherein the first and second sets of coils are formed in pairs each on a respective common electrically insulating body.

9. A device as claimed in claim 6, wherein the alternating current in the conductor is derived as a function of the voltages induced in the first and second sets of series connected coils.

10. A device as claimed in claim 6, wherein both the first and second paths are circular defining a pair of concentric circles.

11. A device as claimed in claim 10, wherein the magnetic axis of each coil is substantially tangential to the respective circle.

12. A device as claimed in claim 10, wherein each coil of the first set is substantially radially aligned with a respective coil of the second set.

13. A device as claimed in claim 10, wherein the support member is configured to allow a conductor to be introduced into the centre of the concentric circles.

14. A device as claimed in claim 1, wherein each coil comprises at least one conductive track deposited on at least one major surface of at least one insulating layer.

15. A device as claimed in claim 14, wherein each coil comprises at least two conductive tracks deposited on at least two different major surfaces of a plurality of substantially parallel laminated insulating layers, the conductive tracks being connected together by via hole(s) in at least one of the layers.

16. A device as claimed in claim 14, wherein the coil support member comprises an insulating plate, the coils being mounted on the plate with the insulating layer(s) substantially normal to the plate.

17. A device as claimed in claim 16, wherein the insulating plate has a plurality of apertures and the coils are mounted thereon by insertion of the insulating layer(s) into the apertures.

18. A device as claimed in claim 16, wherein the first conductive track includes a first track portion substantially coincident with the first circle and second and third track portions substantially parallel to and one on either side of the first track portion, and wherein the second conductive track includes a fourth track portion substantially coincident with the second circle and fifth and sixth track portions substantially parallel to and one on either side of the fourth track portion.

* * * * *